United States Patent
Ogawa et al.

(10) Patent No.: US 8,343,368 B2
(45) Date of Patent: Jan. 1, 2013

(54) METHOD OF FABRICATING A STRUCTURE BY ANISOTROPIC ETCHING, AND SILICON SUBSTRATE WITH AN ETCHING MASK

(75) Inventors: Toshiyuki Ogawa, Yokohama (JP); Takahisa Kato, Tokyo (JP); Kazutoshi Torashima, Yokohama (JP); Takahiro Akiyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 457 days.

(21) Appl. No.: 12/553,015

(22) Filed: Sep. 2, 2009

(65) Prior Publication Data

US 2010/0053716 A1    Mar. 4, 2010

(30) Foreign Application Priority Data

Sep. 4, 2008    (JP) .................................. 2008-226542

(51) Int. Cl.
*B44C 1/22*    (2006.01)
(52) U.S. Cl. ................. 216/41; 216/24; 216/83
(58) Field of Classification Search ............. 216/24, 216/41, 83
See application file for complete search history.

(56) References Cited

U.S. PATENT DOCUMENTS

| 3,765,969 | A  | * | 10/1973 | Kragness et al. ............. 438/753 |
| 6,270,685 | B1 | * | 8/2001  | Ishio et al. ........................ 216/2 |
| 6,831,765 | B2 |   | 12/2004 | Yasuda |
| 2002/0172474 | A1 | * | 11/2002 | Kim et al. ........................ 385/88 |
| 2007/0264744 | A1 | * | 11/2007 | Hwang et al. .................... 438/57 |
| 2009/0130857 | A1 | * | 5/2009  | Torashima et al. ............ 438/733 |

FOREIGN PATENT DOCUMENTS

| JP | 6-163511    | 6/1994 |
| JP | 7-58345     | 3/1995 |
| JP | 2002-321196 A | 11/2002 |

* cited by examiner

*Primary Examiner* — Shamim Ahmed
(74) *Attorney, Agent, or Firm* — Canon, U.S.A., Inc. IP Division (57) ABSTRACT

In a fabrication method of fabricating a structure, a basic etching mask corresponding a target shape with a convex corner, and a correction etching mask with a first portion, a second portion and an opening portion are formed on a single-crystal silicon substrate, and the silicon substrate with the basic etching mask and the correction etching mask formed thereon is subjected to an anisotropic etching to form the silicon substrate having the target shape. The first portion extends in a <110> direction, respective ends of the first portion are connected to the basic etching mask. The second portion is connected to a side of the first portion extending in the <110> direction.

6 Claims, 10 Drawing Sheets

METHOD OF FABRICATING A STRUCTURE BY ANISOTROPIC ETCHING, AND SILICON SUBSTRATE WITH AN ETCHING MASK

BACKGROUND OF THE INVENTION

1. Field of the Invention

The present invention relates to a method of fabricating a structure by anisotropic etching, and a silicon substrate with an etching mask. More particularly, the present invention relates to a single-crystal silicon substrate with an etching mask, a fabrication method of fabricating a structure like a micro structure, such as a movable body apparatus, by using the silicon substrate, an optical deflector fabricated by the fabrication method, and the like. The optical deflector can be preferably used in, for example, a projection display for projecting an image by deflecting and scanning a light beam, and an image forming apparatus, such as a laser beam printer and a digital copying machine using an electrophotographic process.

2. Related Background Art

Heretofore, a semiconductor process makes it possible to produce a micro mechanical structure on a micrometer order from a silicon substrate. A variety of minute functional devices have been fabricated using such technology. Particularly, optical deflectors produced by such technology are characterized in that, comparing with a light scanning optical system using a rotary polygonal mirror, the optical deflector can be made compact to a large extent, and the consumption power thereof can be reduced.

U.S. Pat. No. 6,831,765 discloses an optical deflector fabricated by using an anisotropic wet etching technology that is a kind of the semiconductor process. Further, Japanese Patent Laid-open Nos. Heisei-6 (1994)-163511 and Heisei-7 (1995)-58345 disclose technologies in which a correction etching mask is used to etch a silicon substrate by the anisotropic wet etching and form a desired target shape (a shape corresponding to a basic etching mask).

In a where a silicon substrate is etched by the anisotropic wet etching to form a target shape with high accuracy, a space is generally necessary for arranging the correction etching mask in addition to the basic etching mask. Especially, when the etching amount is large, a large correction etching mask is needed. Accordingly, there is a considerable limitation to the arrangement of structures, such as micro structures, on a silicon wafer. It is thus likely that the number of structures capable of being fabricated from a silicon wafer decreases, and the reduction in costs becomes difficult to attain.

SUMMARY OF THE INVENTION

According to one aspect, the present invention provides a fabrication method of fabricating a structure includes a first step and a second step. In the first step, a basic etching mask corresponding a target shape with a convex corner, and a correction etching mask with a first portion, a second portion and an opening portion are formed on a single-crystal silicon substrate with a (100) principal face. In the second step, the single-crystal silicon substrate with the basic etching mask and the correction etching mask formed thereon is subjected to an anisotropic etching to form the single-crystal silicon substrate having the target shape. The correction etching mask formed in the first step has a shape in which the first portion extends in a <110> direction, respective ends of the first portion are connected to the basic etching mask, and at least an end of the first portion is connected to the convex corner of the basic etching mask. Further, the second portion of the correction etching mask is connected to a side of the first portion extending in the <110> direction, the second portion includes at least a convex corner, and the opening portion extends straddling a boundary between the first portion and the second portion. That is, a portion of the opening portion is formed in the first portion, and another portion of the opening portion is formed in the second portion.

According to another aspect, the present invention provides a silicon substrate with an etching mask in which a basic etching mask corresponding a target shape with a convex corner, and a correction etching mask with a first portion, a second portion and an opening portion are formed on a single-crystal silicon substrate with a (100) principal face. The first portion of the correction etching mask extends in a <110> direction, respective ends of the first portion are connected to the basic etching mask, and at least an end of the first portion is connected to the convex corner of the basic etching mask. Further, the second portion of the correction etching mask is connected to a side of the first portion extending in the <110> direction, the second portion includes at least one convex corner, and the opening portion extends straddling a boundary between the first portion and the second portion.

According to another aspect, the present invention provides a movable body apparatus, such as an optical deflector, which includes a supporting portion, a movable portion movably supported by the supporting portion, an elastic support portion for elastically connecting the movable portion to the supporting portion such that the movable portion is swingingly rotatable about a torsional axis, and a driving portion for driving the movable portion. The movable body apparatus is fabricated by the above-described fabrication method.

According to yet another aspect, the present invention provides an optical instrument, such as an image forming apparatus, which include the movable body apparatus, and a light deflecting member provided on the movable portion in the movable body apparatus. The light deflecting member reflects and deflects a light beam from a light source, and at least a portion of the light beam is applied to a light irradiation object.

According to the present invention, the correction etching mask used in anisotropically etching the structure like the micro structure is formed into the above-described shape, so that a space for arranging the correction etching mask can be reduced. Therefore, many structures can be arranged on a silicon wafer. Thus, the number of structures obtained from a silicon wafer can be increased.

Further features of the present invention will become apparent from the following description of exemplary embodiments, with reference to the attached drawings.

BRIEF DESCRIPTION OF THE DRAWINGS

FIGS. 4G to 4I are cross-sectional views taken along a line b-b' of FIG. 4C and lines c-c' and d-d' of FIG. 4D, respectively.

DETAILED DESCRIPTION OF THE EMBODIMENTS

Embodiments of the present invention will hereinafter be described. An important point of the fabrication method and the silicon substrate with an etching mask according to the present invention is as follows. That is, at least one end of a correction etching mask is connected to a convex corner of a basic etching mask, the correction etching mask includes a bending portion, an opening portion is formed near the bending portion, and the bending portion includes at least one convex corner. Such a correction etching mask can be arranged in a comparatively narrow space, and etched at an appropriate rate until a target shape corresponding to a basic etching mask with a convex corner is formed. Thus, the convex corner of the target shape can be protected. Based on this important point, the fabrication method and the silicon substrate with an etching mask according to the present invention have the above-described constructions, respectively.

Exemplified embodiments can have the following constructions. The second step can include a step in which a portion of the single-crystal silicon substrate, on which the correction etching mask is formed, is removed. The basic etching mask and the correction etching mask can be formed on each of both opposite surfaces of the single-crystal silicon substrate. In the second step, the single-crystal silicon substrate with a (100) principal face is etched and penetrated with an anisotropic etchant so that the target shape with the convex corner can be formed.

Further, the single-crystal silicon substrate has a thickness of t, the first portion has a first longer side in contact with the convex corner of the basic etching mask, and a second longer side approximately parallel to the first longer side, and a distance w1 between the first longer side and the second longer side is equal to or more than t/1.41. The second portion extends in the <110> direction from the second longer side or first longer side, a distance w2 between the opening portion and the first longer side or second longer side is equal to or less than t/1.41. Thereby, when the correction etching mask is fully etched, the etching amount of a silicon portion under the convex corner of the basic etching mask can be minimized. Accordingly, the convex corner of the target shape can be accurately formed, the target shape of a structure can be accurately fabricated, and a structure, such as a high-performance movable body apparatus, can be provided.

Further, the opening portion can be formed so as to be surrounded by the first portion and the second portion. Also due to this configuration, the etching amount of a silicon portion under the convex corner of the basic etching mask can be minimized when a silicon portion under the correction etching mask is fully etched.

Further, in the first step, a correction etching mask on a bottom surface of the silicon substrate can be formed into a shape that is made by projecting a correction etching mask on a top surface of the silicon substrate on the bottom surface. Thereby, the number of photo-masks necessary for fabrication of the correction etching mask can be decreased, and the fabrication cost of a micro structure or the like can be reduced.

Using the structure fabricated by the above-described fabrication method, the above-described movable body apparatus can be provided. Further, using this movable body apparatus, the above-described optical instrument like an image forming apparatus can be provided. The fabrication method of the present invention can be applied to fabrication of any structure having a target shape with a convex corner. Micro structures, such as an acceleration sensor and an angular velocity sensor, capable of being fabricated by a micro machine technology can also be produced.

More specific embodiments of the present invention will be described with reference to the drawings.

Figure 2:
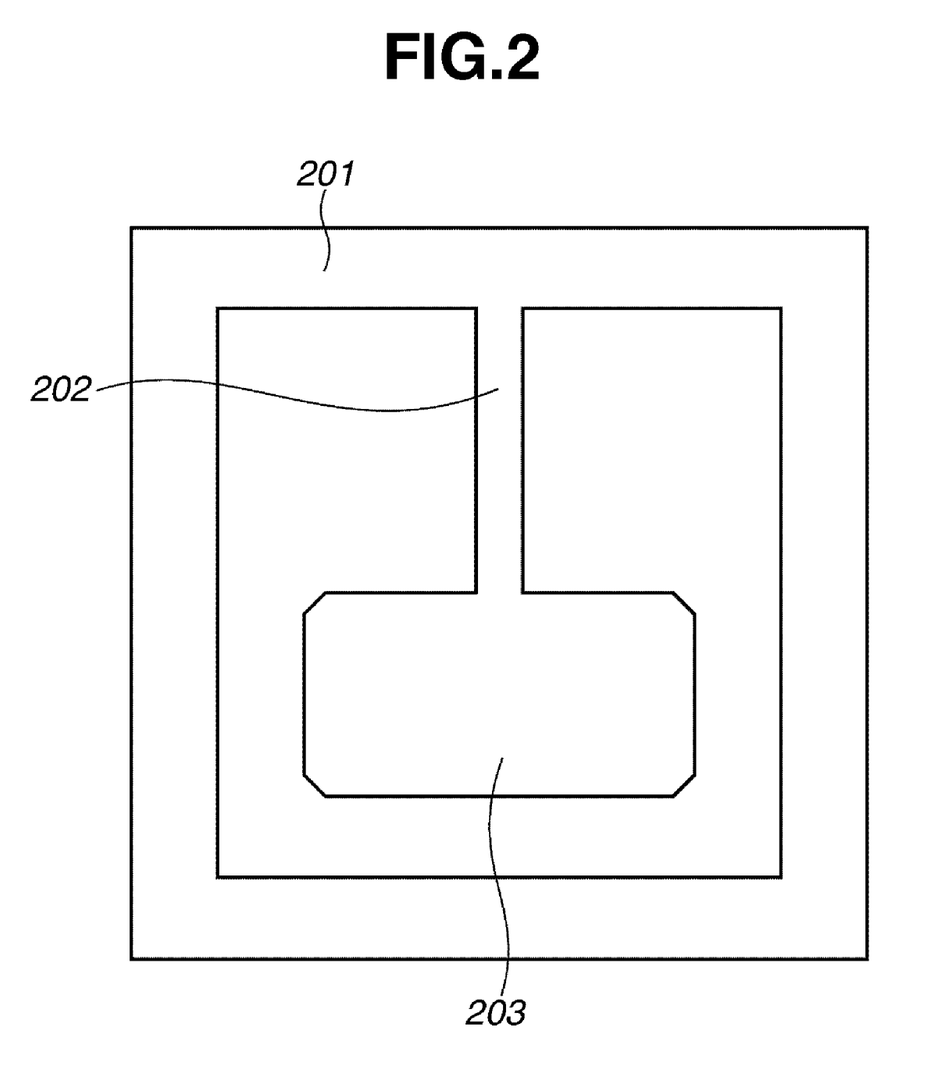
FIG. 2 is a plan view illustrating a micro oscillator or optical deflector fabricated by a fabrication method of the first embodiment.
Figure 3:
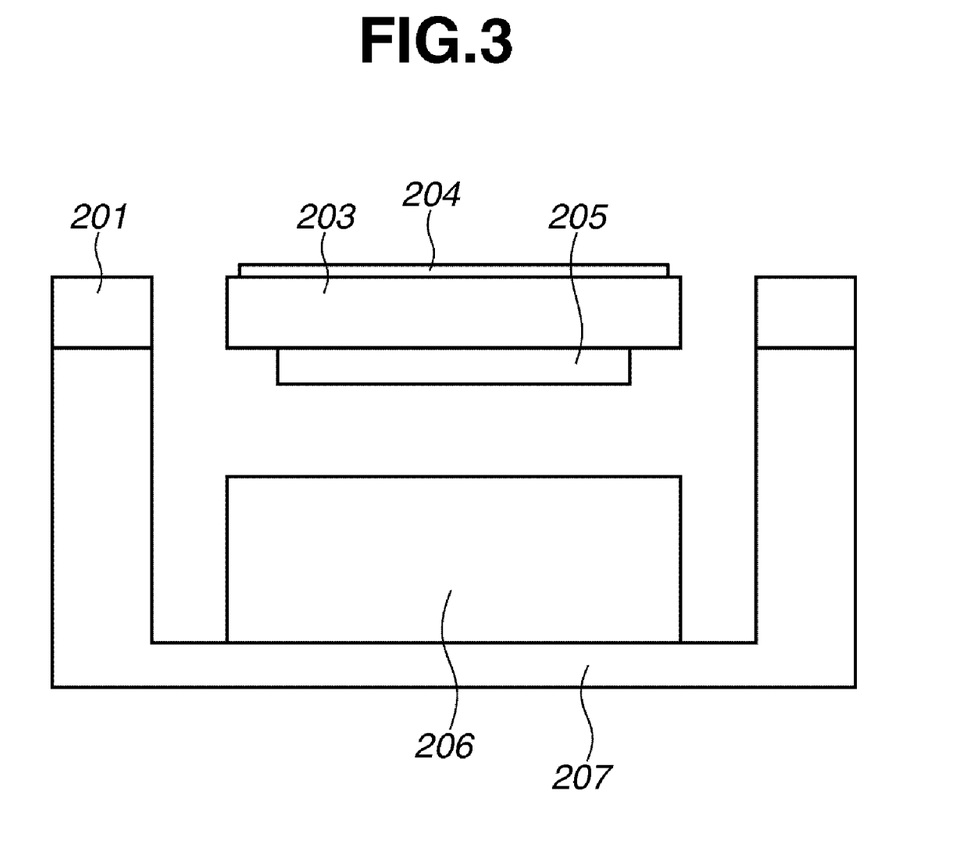
FIG. 3 is a cross-sectional view of the micro oscillator or optical deflector illustrated in FIG. 2.

A first embodiment will be described with reference to FIGS. 1A to 4I. In a fabrication method of fabricating a structure like a micro structure of the first embodiment, a target shape is a movable body apparatus as illustrated in FIGS. 2 and 3. The target shape includes a supporting portion 201, an elastic support portion 202, and a movable portion 203 swingingly rotatable about a torsional axis defined by the elastic support portion 202. The structure includes a reflective surface or light deflecting member 204, a magnetic material 205, a coil 206, and a coil support portion 207, as illustrated in FIG. 3. The structure can be used as an optical deflector for reflecting and deflecting a light beam applied onto the reflective surface 204. Although the applicable range of this embodiment is not limited to the micro structure, the micro structure is described in the following description.

In the fabrication method of fabricating the micro structure of this embodiment, a single-crystal silicon substrate 100 with a (100) principal face is subjected to an anisotropic wet etching to form the target shape. The anisotropic wet etching uses an etchant with characteristics that the etching does not advance in a predetermined crystallographic direction, so that a structure defined by crystal faces can be fabricated with highly tight tolerances. The anisotropic etchant can be KOH (potassium hydroxide), TMAH (tetramethy ammonium hydroxide water solution), EDP (ethylene diamine pyrocatechol+water), NaOH (sodium hydroxide), hydrazine, or the like.

When the single-crystal silicon substrate is etched with the anisotropic etchant, a basic etching mask corresponding to the target shape is used together with a correction etching mask for protecting a convex corner of the target shape so that the substrate can be etched into an exact target shape. The correction etching mask prevents the convex corner of the target shape from being etched while the silicon substrate is etched into the target shape. Therefore, an end of the correction etching mask is connected to the convex corner in such a manner that a shape of the convex corner disappears.

Figure 1A:
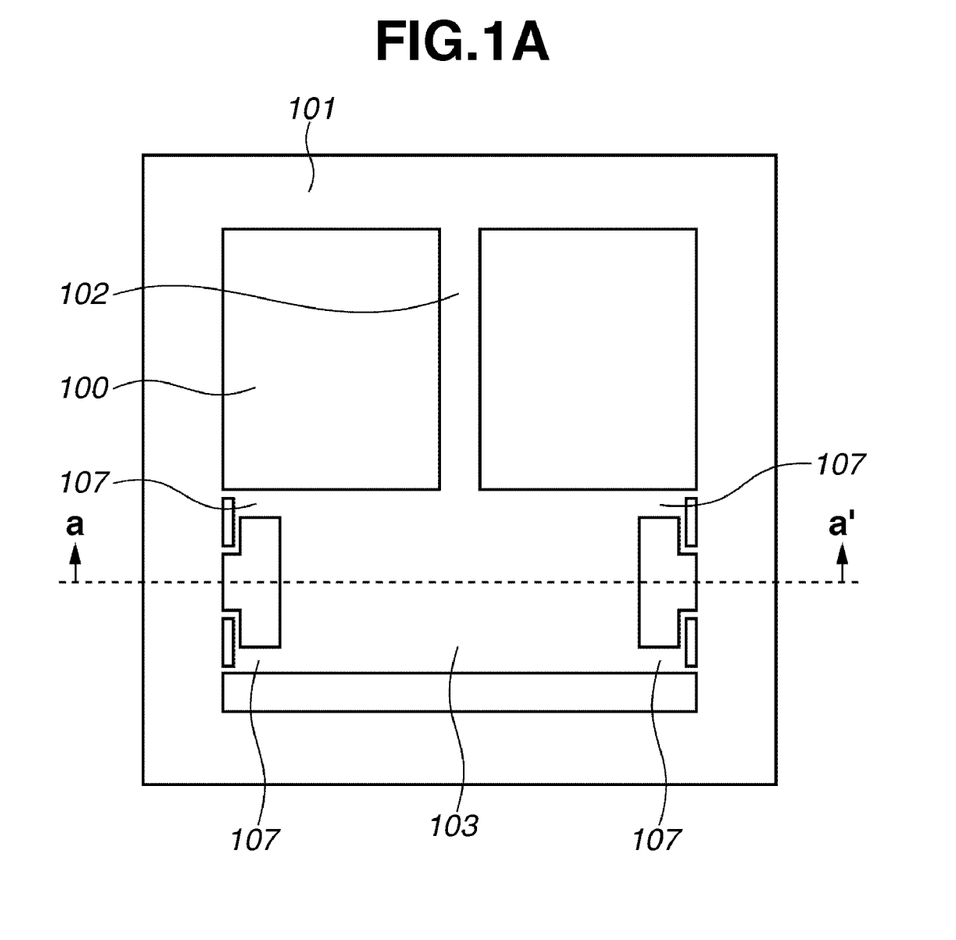
FIG. 1A is a plan view illustrating an etching mask used in a first embodiment of the present invention.

As illustrated in FIG. 1A, the basic etching mask includes portions 101, 102 and 103 respectively corresponding to the supporting portion 201, the elastic support portion 202 and the movable portion 203. In the following description, these mask portions are often referred to as the supporting portion 101 and the like. The correction etching mask includes a portion 107. Similarly, the portion 107 is often referred to as the correction etching mask 107 or the like. Thus, the correction etching mask 107 illustrated in FIG. 1A prevents the etching of the convex corner of the movable portion 203 until the support portion 201, the elastic support portion 202 and the movable portion 203 shown in FIG. 2A are formed.

Figure 1B:
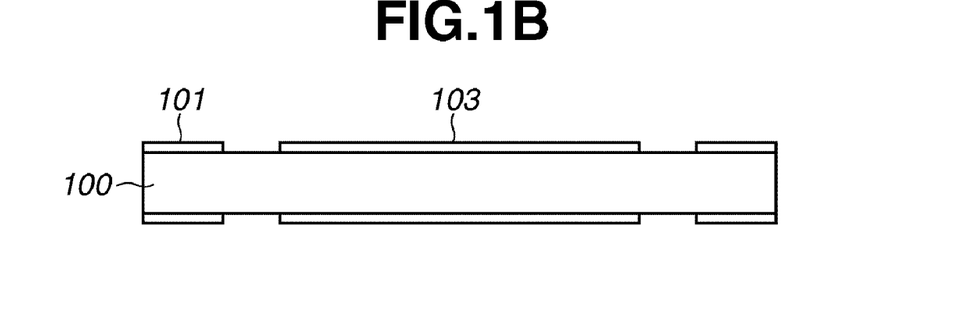
FIG. 1B is a cross-sectional view taken along a line a-a' of FIG. 1A.

The fabrication method of this embodiment will be described. Mask materials are deposited on both opposite surfaces of the single-crystal silicon substrate 100 with a (100) principal face. The mask material can be any material that cannot be extinguished while the silicon substrate is etched with the anisotropic etchant. For example, the mask material layer is a silicon nitride layer, or a silicon oxide layer. By photolithography and patterning of the mask material, a mask pattern as illustrated in FIGS. 1A and 1B can be formed on top and bottom surfaces of the silicon substrate 100. The mask pattern on the bottom surface of the silicon substrate 100 has a shape formed by projection of the mask pattern on the top surface onto the bottom surface of the silicon substrate 100. After the mask pattern is formed, the silicon substrate 100 is immersed into the anisotropic etchant to form the target shape as illustrated in FIG. 2.

When a side surface of the silicon substrate 100 is exposed to the etchant, it is desirable to deposit the mask material also on the side surface. Further, plural micro structures can be fabricated from a single silicon substrate. In this case, since the micro structures are adjacent to each other, the mask material is deposited on the side surface of the single silicon substrate. Furthermore, it is also possible to form the mask pattern only on one surface of the silicon substrate and deposit the mask material on the other surfaces of the silicon substrate. In this case, however, it is necessary to appropriately set the above-mentioned w1, w2 and the like considering the thickness t of the silicon substrate, in accordance with such etching manner. The etching process is also different from that illustrated in FIGS. 4G, 4H and 4I described below.

In the fabrication method of this embodiment, the correction etching mask 107 is connected to the movable portion 103 and the supporting portion 101 of the basic etching mask. In this specification, crystallographically equivalent directions and equivalent faces are represented by the same notations, respectively. For example, a <001> direction is written as a <100> direction.

Figure 4A:
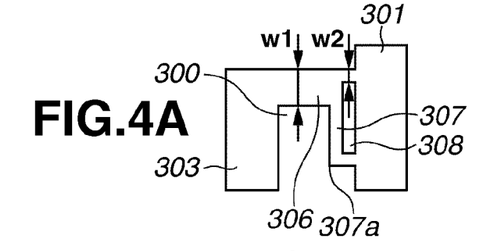
FIGS. 4A to 4F are plan views illustrating etching processes around a correction etching mask used in the first embodiment.
Figure 4B:
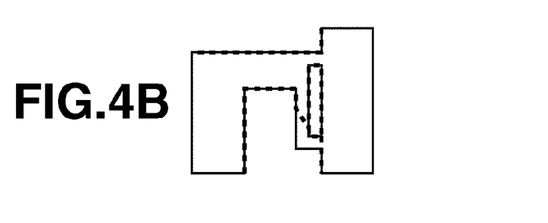
Figure 4C:
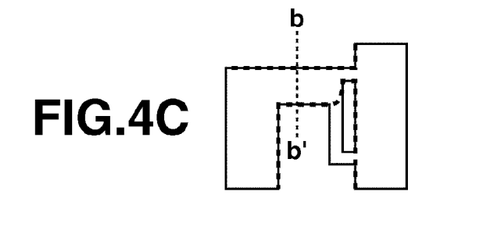

The etching mask of this embodiment will be described in detail. FIGS. 4A to 4I illustrate the correction etching mask in an enlarged manner. In FIGS. 4A to 4I, the etching process at an upper right portion 107 of the correction etching mask in FIG. 1A is shown. In these figures, portions corresponding to those in FIG. 1A are designated by numerals on a three-hundred order. Dotted lines in FIGS. 4A to 4I illustrate shapes of silicon portions under the basic etching masks 301 and 303, and the correction etching masks 306 and 307. As illustrated in FIG. 4A, a basic etching mask 301 of the support portion and a basic etching mask 303 of the movable portion are formed on a (100) principal face of a single-crystal silicon substrate 300. Further, a correction etching mask 306 and 307 is formed. The correction etching mask connects the basic etching mask 303 to the basic etching mask 301. In this embodiment, the correction etching mask (a first portion) 306 extends in a <100> direction to connect the basic etching mask 303 to the basic etching mask 301. The correction etching mask (a second portion) 307 extends in a <110> direction from a lower side of the correction etching mask 306 in FIG. 4A.

An opening portion 308 extends in the <110> direction straddling a boundary between the correction etching mask portions 306 and 307, and is surrounded by the correction etching masks 306 and 307. With respect to sizes of the correction etching mask 306 and 307, w1 is equal to or more than $t/1.41$, and w2 is equal to or less than $t/1.41$ where t is the thickness of the silicon substrate 300. The correction etching mask 307 extends in the <110> direction from a side opposite to a side of the correction etching mask 306 in contact with a convex corner of the basic etching mask 303 (an upper side in FIG. 4A). Thereby, the etching amount of the convex corner of the target shape can be minimized. Alternatively, the correction etching mask 307 can extend in the <110> direction from the side of the correction etching mask 306 in contact with the convex corner. In this case, however, the etching amount of the convex corner of the target shape becomes a little larger than that in the above case.

When the silicon substrate 300 is immersed in an anisotropic wet etchant, the etching of the silicon substrate 300 advances in the <100> direction perpendicular to a sheet of FIG. 4A. Simultaneously, the silicon is also etched from a portion under a convex corner 307a of the correction etching mask 307, as illustrated by the dotted line in FIG. 4B. Further, as the etching advances, the silicon substrate 300 is fully etched in the <100> direction perpendicular to a sheet of FIG. 4C. At this point of time, the b-b' cross-sectional portion under the correction etching mask 306 is etched as illustrated in FIG. 4G.

Figure 4D:
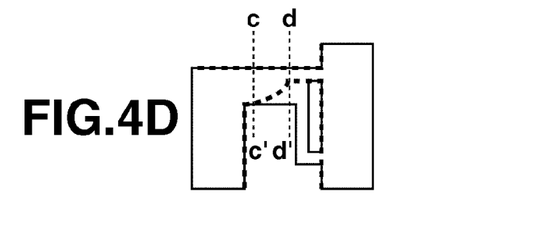

As the etching further advances, the silicon portion under the correction etching mask 307 is fully etched, and the silicon portion under the correction etching mask 306 begins to be etched, as illustrated in FIG. 4D. At this point of time, the c-c' cross-sectional portion under the correction etching mask 306 near the basic etching mask 303 of the movable portion is etched as illustrated in FIG. 4H. An angle formed between the (100) face of the top surface of the substrate and a (111) face of a side wall is 54.7°.

Here, the following relations are established.

$$a = t/2 \tan 54.7° \text{ (tan } 54.7°·1.41)$$

$$2a = t/1.41$$

Where the width w1 is larger than $t/1.41$, (111) faces of side walls are barely etched. Accordingly, a portion between the (111) faces of side walls is not penetrated.

Figure 4E:
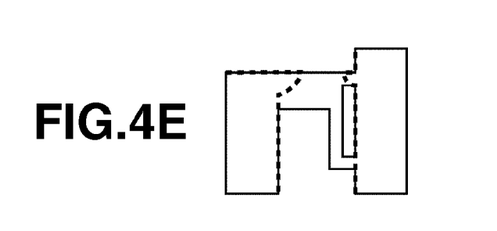
Figure 4F:
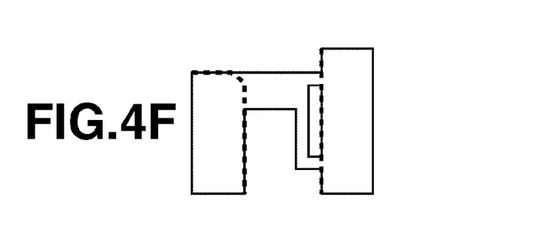
Figure 4I:
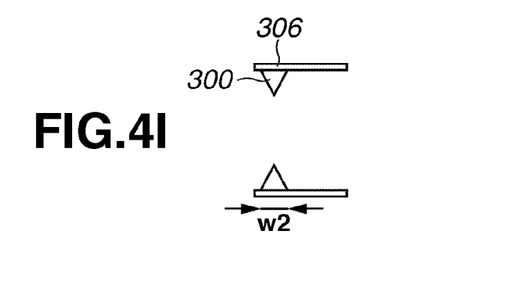

In contrast therewith, the d-d' cross-sectional portion under the correction etching mask 306 near the opening portion 308 is etched as illustrated in FIG. 4I. Since the width w2 is less than $t/1.41$, a portion between the (111) faces of side walls is penetrated. As the etching further advances, the etching begins to proceed from the penetrated portion toward the top surface of the substrate. Thus, the silicon portion under the correction etching mask 306 near the opening portion 308 is fully etched as illustrated in FIG. 4E.

A silicon portion under the basic etching mask 303 of the movable portion finally remains, and the target shape is obtained as illustrated in FIG. 4F. In the forming process of the target shape, while the silicon portion under the correction etching mask 306 is fully etched, a side etching advances and the convex corner of the movable portion 103 is slightly etched. In the above-described modification case where the correction etching mask 307 extends upward, the etching amount of the convex corner in the target shape somewhat increase as described above. The reason therefor is that a projection portion indicated by the dotted line in FIG. 4E is formed at a lower portion of the convex corner and the etching of the convex corner slightly advances.

Figure 8:
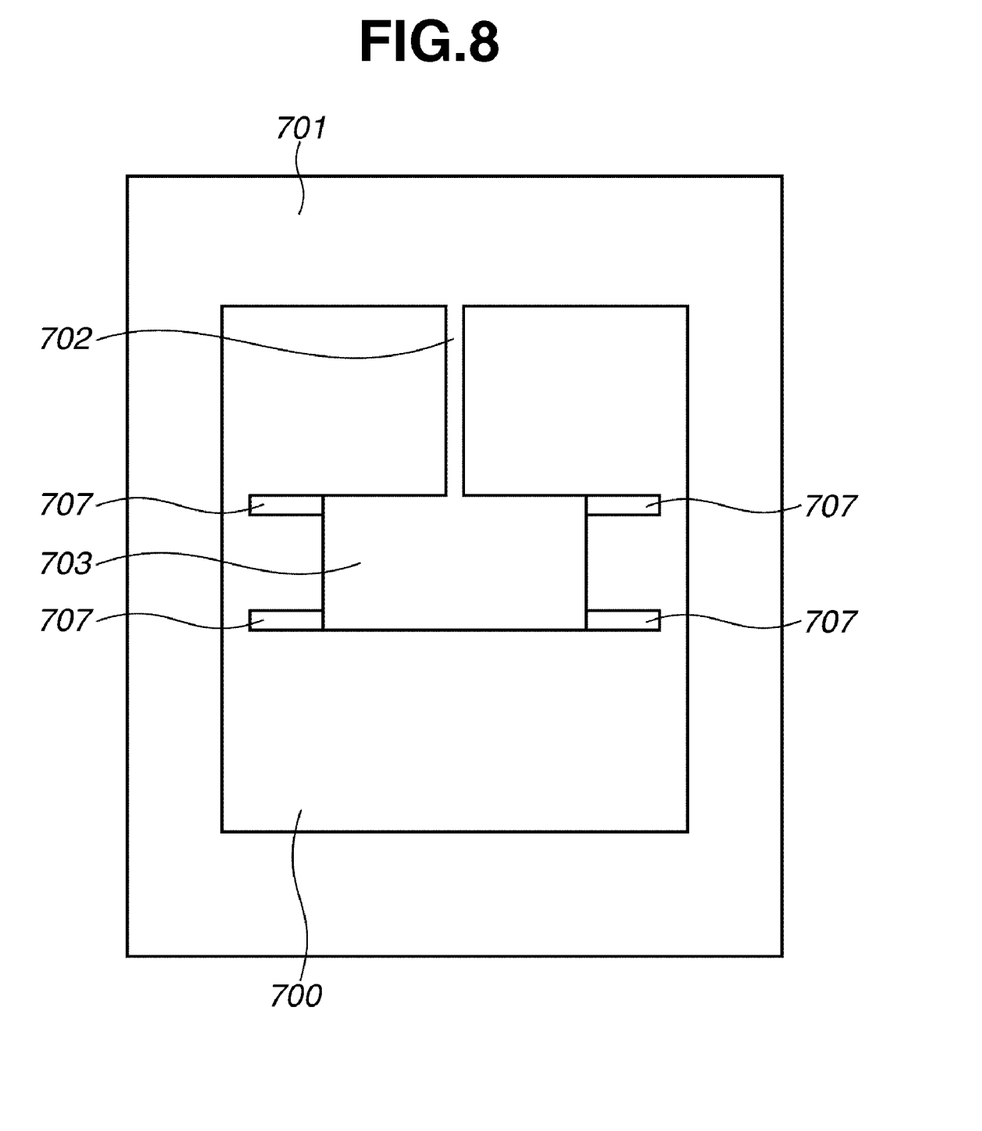
FIG. 8 is a plan view illustrating an etching mask used in a comparative example.

A comparative example will be described. In the comparative example, an etching mask as illustrated in FIG. 8 is used to fabricate a target shape of a micro structure. In FIG. 8, one end of a correction etching mask 707 is connected to a convex corner of a basic etching mask 703. The other end of the correction etching mask 707 is connected to nowhere. FIGS. 9A to 9D illustrate the correction etching mask 707 in FIG. 8 in an enlarged manner.

Figure 9A:
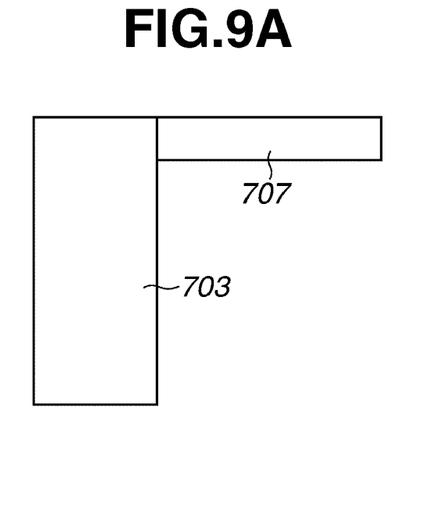
FIGS. 9A to 9d are plan views illustrating etching processes around a correction etching mask used in the comparative example.
Figure 9B:
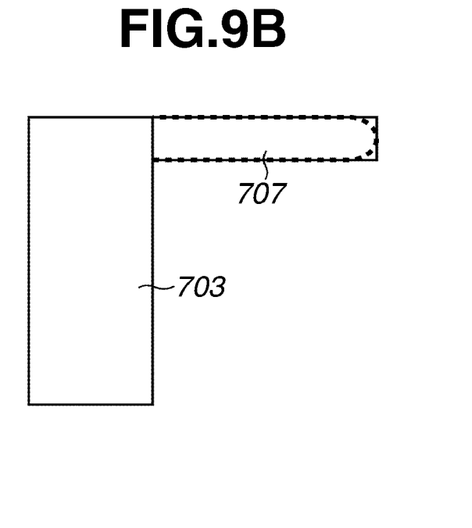
Figure 9C:
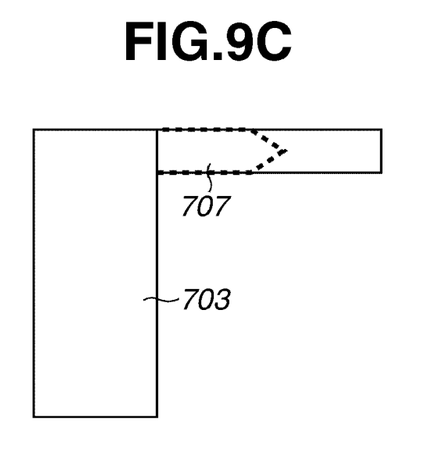
Figure 9D:
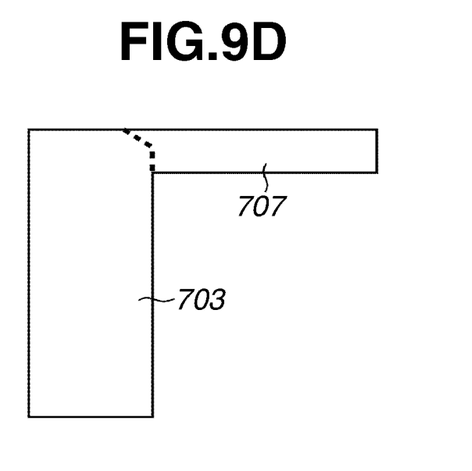

In the comparative example, as illustrated in FIG. 9A, a basic etching mask 703 of the movable portion and the correction etching mask 707 are formed on a (100) face of a single-crystal silicon substrate 700. When the silicon substrate 700 is immersed in an anisotropic wet etchant, the etching advances in a <100> direction perpendicular to a sheet of FIG. 8 and a silicon portion under the correction etching mask 707 is also etched as indicated by dotted lines in FIGS. 9B and 9C. Finally, a silicon portion under the basic etching mask 703 of the movable portion remains to achieve the target shape as illustrated in FIG. 9D.

In this case, the correction etching mask 707 has a length corresponding to an etching time needed to etch a portion surrounding the basic etching mask. In a case where the etching time is long, the size of the correction etching mask 707 increases, so that plural micro structures cannot be arranged closely to each other. Therefore, the number of micro structures capable of being fabricated from a single silicon wafer decreases. The fabrication cost of the micro structure is hence likely to increase.

On the other hand, in a case where a correction etching mask has a rectangular shape extending in the <110> direction with its ends being connected to a basic etching mask, exposure of a (111) face with a low etching rate occurs. Accordingly, no etching of a silicon portion under the correction etching mask is likely to happen. Hence, there is a possibility that the correction etching mask does not appropriately act and the silicon substrate cannot be formed into the target shape.

In contrast, in this embodiment, the above-described correction etching mask is arranged so that adjacent basic etching masks are connected thereby. It is possible to reduce an area on a silicon wafer necessary for arrangement of the correction etching mask. Therefore, the number of micro structures capable of being arranged on a single silicon wafer increases. The fabrication cost of the micro structure is hence decreases.

When this embodiment is used as an optical deflector, a reflective surface or light deflecting member is formed on the movable portion as described above. Material of the reflective surface is, for example, aluminum. It can be formed by vacuum evaporation. A protective layer or dielectric multilayer can be formed on the reflective surface. Sizes of the optical deflector are as follows, for example. The length of the movable portion in a direction orthogonal to the torsional axis is 1.3 mm, its length in a direction parallel to the torsional axis is 1.5 mm, and its thickness is 0.2 mm. The entire length of a chip of the optical deflector is, for example, 10 mm.

Further, as described above, the etching mask can be formed by depositing a silicon nitride layer to a thickness of 2000 angstroms using LPCVD (Low Pressure CVD), for example. The silicon nitride layer is highly resistive to potassium hydroxide solution, so that it cannot be extinguished while the silicon substrate is etched by an anisotropic etchant. The etching is executed as follows, for example. A patterned single-crystal silicon substrate is etched with an anisotropic etchant of potassium hydroxide solution (30 weight percent concentration) heated to 110 degrees centigrade. After the etching, the etching mask of silicon nitride layer is removed by a dry etching, for example.

Figure 5:
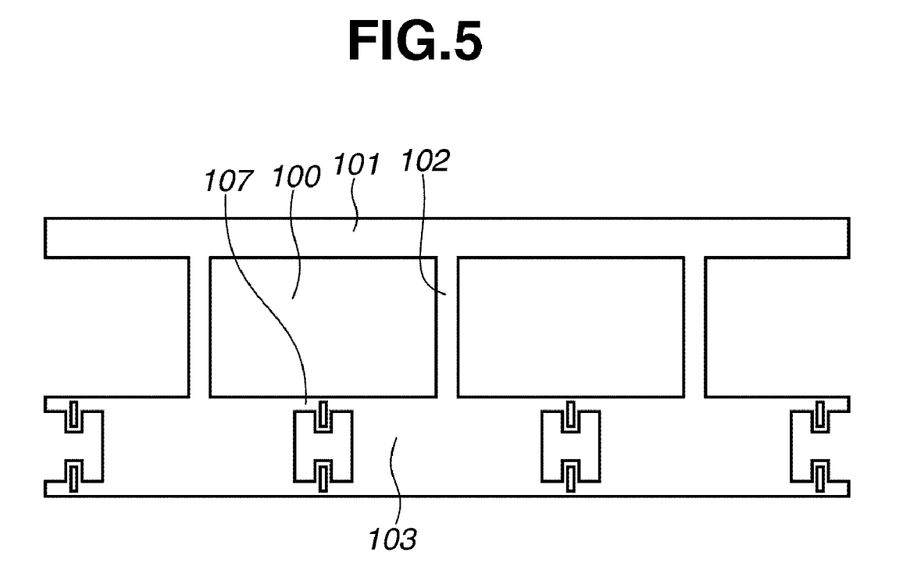
FIG. 5 is a plan view illustrating an etching mask used in a second embodiment of the present invention.
Figure 6:
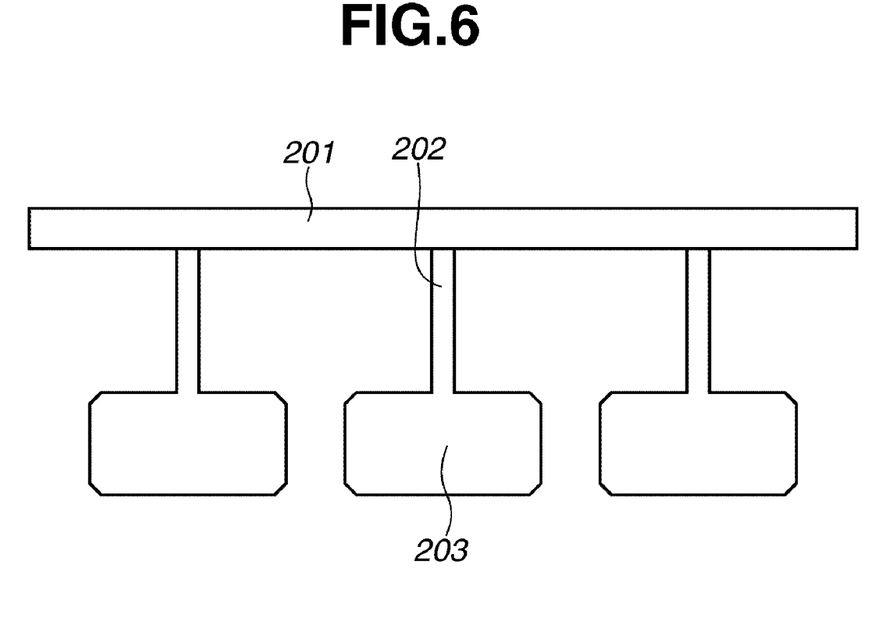
FIG. 6 is a plan view illustrating a micro oscillator or optical deflector fabricated by a fabrication method of the second embodiment.

A second embodiment will be described with reference to FIGS. 5 to 7I. FIG. 5 illustrates an etching mask for fabricating a micro structure. FIG. 6 illustrates the micro structure fabricated by etching a single-crystal silicon substrate with an anisotropic etchant. FIGS. 7A to 7I illustrate a way how the silicon substrate under a correction etching mask of the second embodiment is etched with the anisotropic etchant. Fundamentally, the second embodiment is similar to the first embodiment.

In a target shape of this embodiment, plural micro structures are periodically arranged in an adjacent manner, as illustrated in FIG. 6. Plural elastic support portions 202 are connected to a supporting portion 201, and a movable portion 203 is connected to each elastic supporting portion 202. With respect to the etching mask, correction etching masks 107 are arranged connecting to each other convex corners of basic etching masks 103 for adjacent movable portions, as illustrated in FIG. 5. In FIG. 5, portions corresponding to those in FIG. 1A are designated by like reference numerals.

The etching mask of this embodiment will be described in detail. FIGS. 7A to 7I illustrate the correction etching mask in an enlarged manner. Also in FIGS. 7A to 7I, portions corresponding to those in FIGS. 4A to 4I are designated by like reference numerals.

Figure 7A:
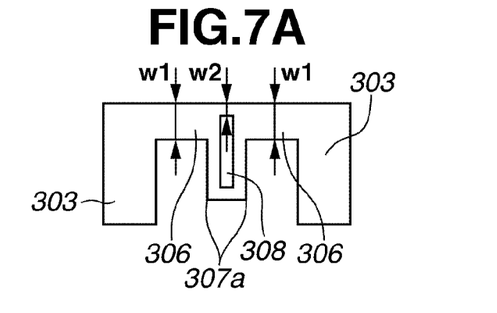
FIGS. 7A to 7F are plan views illustrating etching processes around a correction etching mask used in the second embodiment.
Figure 7B:
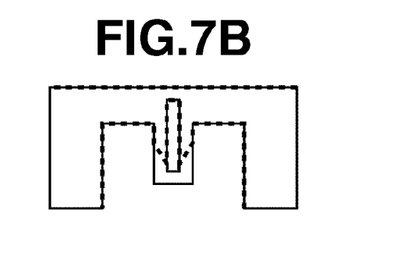
Figure 7C:
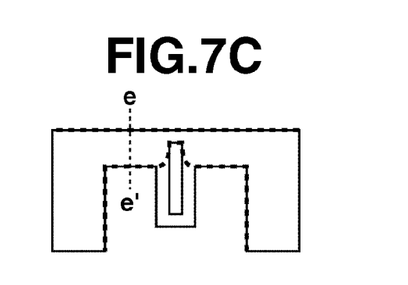

As illustrated in FIG. 7A, a basic etching mask (not shown therein) of the supporting portion and a basic etching mask 303 of the movable portion are formed on a (100) principal face of a single-crystal silicon substrate 300. Further, a correction etching mask 306 and 307 is formed. The correction etching mask connects the adjacent basic etching masks 303 of the movable portion to each other. In this embodiment, the correction etching mask (a first portion) 306 extends in the <100> direction to connect the adjacent basic etching masks 303 to each other. The correction etching mask (a second portion) 307 extends in the <110> direction from a central portion of a lower side of the correction etching mask 306, as illustrated in FIG. 7A.

An opening portion 308 extends in the <110> direction straddling a boundary between the correction etching masks 306 and 307, and is surrounded by the correction etching masks 306 and 307. This configuration is basically the same as that of the correction etching mask 306 and 307, and opening portion 308 in the first embodiment. The correction etching mask 307 extends in the <110> direction from a side opposite to a side of the correction etching mask 306 in contact with a convex corner of the basic etching mask 303 (an upper side in FIG. 7A). Thereby, the etching amount of the convex corner of the target shape can be minimized. In FIGS. 7A to 7I, dotted lines indicate shapes of silicon portions under the basic etching mask 303, and the correction etching mask 306 and 307.

Also in this embodiment, when the silicon substrate 300 is immersed in the anisotropic wet etchant, the silicon substrate 300 begins to be etched in the <100> direction perpendicularly to a sheet of FIG. 7A. Simultaneously, a silicon portion under the correction etching mask 307 is also etched from a portion under a convex corner 307a of the correction etching mask 307, as illustrated by the dotted line in FIG. 7B. As the etching advances, the silicon substrate 300 is fully etched in the <100> direction perpendicularly to a sheet of FIG. 7C. At this point of time, an e-e' cross-sectional portion under the correction etching mask 306 is etched as illustrated in FIG. 7G.

Figure 7D:
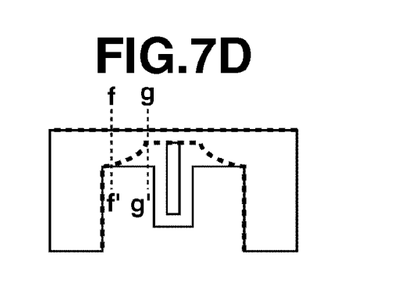
Figure 7E:
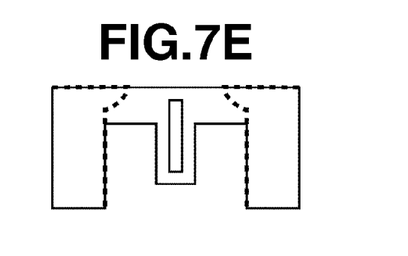

As the etching further advances, a silicon portion under the correction etching mask 307 is fully etched, and a silicon portion under the correction etching mask 306 begins to be etched, as illustrated in FIG. 7D. At this point of time, an f-f' cross-sectional portion under the correction etching mask 306 near the basic etching mask 303 of the movable portion is etched as illustrated in FIG. 7H. An angle formed between a (100) face of the surface of the substrate and a (111) face of an exposed side wall is 54.7°. Here, the width w1 of the correction etching mask 306 is equal to or more than t/1.41 where t is the thickness of the silicon substrate 300. Accordingly, (111) faces of the side walls are barely etched, so that a portion between (111) faces of the side walls is not penetrated.

Figure 7F:
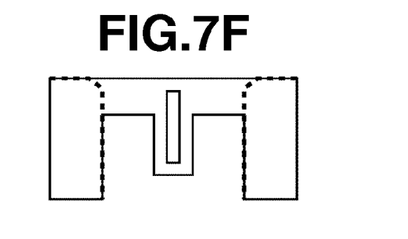
Figure 7G:
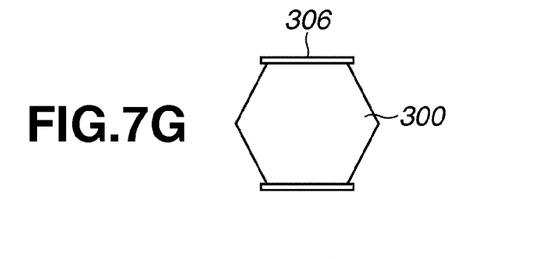
FIGS. 7G to 7I are cross-sectional views taken along a line e-e' of FIG. 7C and lines f-f' and g-g' of FIG. 7D, respectively.
Figure 7H:
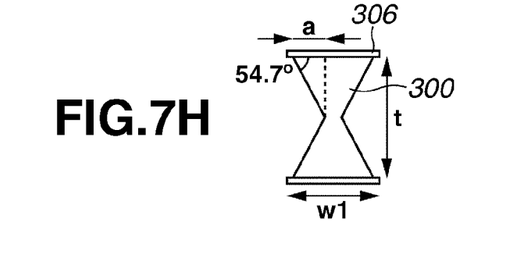
Figure 7I:
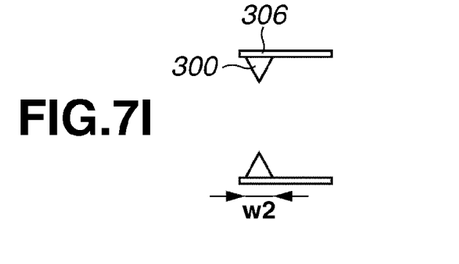

In contrast therewith, a g-g' cross-sectional portion under the correction etching mask 306 near the opening portion 308 is etched as illustrated in FIG. 7I. Here, since the width w2 of the correction etching mask 306 is equal to or more than t/1.41, a portion between (111) faces of the side walls is penetrated. As the etching further advances, the etching advances from the penetrated portion toward the surface of the substrate. Thus, the silicon portion under the correction etching mask 306 near the opening portion 308 is fully etched, as illustrated in FIG. 7E.

A silicon portion under the basic etching masks 303 of the movable portion finally remains, and the target shape is obtained as illustrated in FIG. 7F. In the target shape, while the silicon portion under the correction etching mask 306 is fully etched, a side etching advances and the convex corner of the movable portion 203 is slightly etched.

In this embodiment, the above-described correction etching mask is arranged so that convex portions of the adjacent basic etching masks are connected thereby. It becomes possible to reduce an area on a silicon wafer necessary for arrangement of the correction etching masks. Accordingly, a distance between adjacent micro structures arranged on a silicon wafer can be decreased. Therefore, the number of micro structures capable of being arranged on a single silicon wafer increases. The fabrication cost of the micro structure can be hence reduced.

Figure 10:
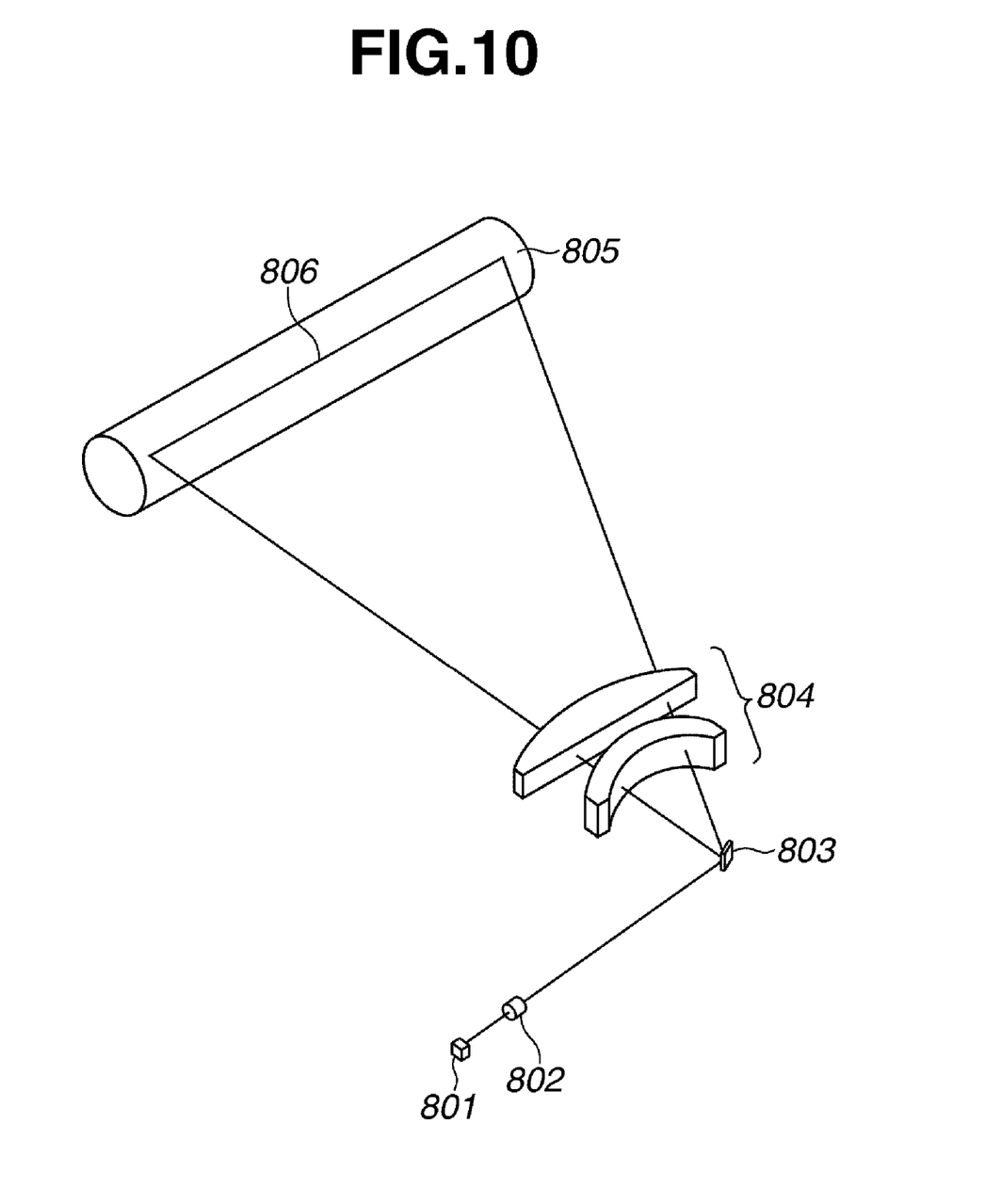
FIG. 10 is a perspective view illustrating an image forming apparatus of a third embodiment of the present invention.

A third embodiment will be described with reference to FIG. 10. This embodiment is directed to an image forming apparatus including the optical deflector described above. In this embodiment, an optical deflector 803 deflects and scans an incident light beam one-dimensionally. In FIG. 10, reference numeral 801 designates a light source or laser, reference numeral 802 designates a lens or lens group, reference numeral 804 designates a writing lens or lens group, reference numeral 805 designates a photosensitive member which is the light irradiation object, and reference numeral 805 designates a scanning trajectory.

The light beam from the light source 801 is intensity-modulated in synchronization with a deflection timing of the light beam. The scanned light beam forms an image on the photosensitive member 805 through the writing lens 804. The photosensitive member 805 is uniformly charged by a charging unit (not shown), and an electrostatic latent image is formed on the photosensitive member 805 when the light beam is scanned thereon. A toner image is formed on the electrostatic latent image by a developing unit (not shown). The toner image is transferred and fixed on a sheet (not shown), and the image is formed on the sheet, for example. Since the optical deflector can be fabricated at relatively low costs, the image forming apparatus can also be fabricated at relatively low costs.

The optical deflector can also be used in other optical instruments in which a light beam from a light source is reflected and deflected, and at least a portion of the light beam is applied to a light irradiation object. The optical instrument can be a laser beam printer, an image displaying apparatus, a bar code reader, and the like.

Except as otherwise discussed herein, the various components shown in outline or in block form in the Figures are individually well known and their internal construction and operation are not critical either to the making or using, or to a description of the best mode of the invention.

This application claims the benefit of Japanese Patent Application No. 2008-226542, filed Sep. 4, 2008, which is hereby incorporated by reference herein in its entirety.

What is claimed is:

1. A fabrication method of fabricating a structure, the method comprising:
    a first step of forming a basic etching mask corresponding a target shape with a first shape having a convex corner, a second shape adjacent to the first shape with a space therebetween, and a correction etching mask with a first portion extending from a portion corresponding to the convex corner of the first shape, a second portion connected to the first portion, and an opening portion on a single-crystal silicon substrate with a (100) principal face; and
    a second step of subjecting the single-crystal silicon substrate with the basic etching mask and the correction etching mask formed thereon to an anisotropic etching and penetrating the single-crystal silicon in a position where corresponding to the space to form the single-crystal silicon substrate having the target shape,
    wherein, in the first step, the first portion of the correction etching mask extends in a <110> direction from the portion of the basic etching mask corresponding to the convex corner of the first shape, connected to the portion of the basic etching mask corresponding to the second shape and connects with the second portion at an end of the first portion extending in the <110> direction, the second portion has at least one convex corner, and the opening portion is surrounded by the first portion, the second portion and the portion corresponding to the second shape of the basic etching mask, and extends straddling a boundary between the end extending in the <110> direction of the first portion and the connected section of the second portion.

2. The fabrication method according to claim 1, wherein the second step includes a step of removing a portion single-crystal silicon substrate at which the correction etching mask is formed.

3. The fabrication method according to claim 1, wherein in the first step, basic etching masks and correction etching masks are formed on both opposite surfaces of the single-crystal silicon substrate, respectively, and
    wherein in the second step, the single-crystal silicon substrate with the (100) principal face is fully etched with an anisotropic etchant so that the silicon substrate is penetrated and the silicon substrate having the target shape with a convex corner is fabricated.

4. The fabrication method according to claim 1, wherein in the first step, a thickness of the single-crystal silicon substrate is t, the first portion has a first longer side in contact with the convex corner of the basic etching mask and a second longer side approximately parallel to the first longer side, and a distance between the first longer side and the second longer side is equal to or more than t/1.41, and
    wherein in the first step, the second portion extends in the <110> direction from the second longer side or the first longer side, and a distance between the opening portion and the first longer side or the second longer side is equal to or less than t/1.41.

5. The fabrication method according to claim 1, wherein in the first step, the opening portion is formed so as to be surrounded by the first portion and second portion.

6. The fabrication method according to claim 3, wherein in the first step, the correction etching mask on a bottom surface of the silicon substrate is formed into a shape which is made by projecting the correction etching mask on a top surface of the silicon substrate onto the bottom surface of the silicon substrate.

* * * * *